United States Patent [19]

Adams et al.

[11] 4,357,179

[45] Nov. 2, 1982

[54] METHOD FOR PRODUCING DEVICES COMPRISING HIGH DENSITY AMORPHOUS SILICON OR GERMANIUM LAYERS BY LOW PRESSURE CVD TECHNIQUE

[75] Inventors: Arthur C. Adams, Berkeley Heights; David E. Aspnes; Brian G. Bagley, both of Watchung, all of N.J.

[73] Assignee: Bell Telephone Laboratories, Incorporated, Murray Hill, N.J.

[21] Appl. No.: 220,121

[22] Filed: Dec. 23, 1980

[51] Int. Cl.$^3$ .......................................... H01L 21/205
[52] U.S. Cl. ................................. 148/1.5; 427/53.1; 427/74; 427/85; 427/86; 427/88; 427/95; 427/99; 427/248.1; 430/135; 430/136; 427/35
[58] Field of Search ...................... 427/85, 86, 88, 84, 427/95, 99, 74, 35, 53.1, 248.1; 430/135, 136; 148/1.5

[56] References Cited

U.S. PATENT DOCUMENTS 4,217,374 8/1980 Orshinsky ............................ 427/86
4,225,222 9/1980 Kempter ............................ 430/135

OTHER PUBLICATIONS

Makimo et al., *Japanese Journal of Applied Physics*, vol. 17 (10), pp. 1897–1898 (1978).
Taniguchi et al., *Journal of Electronic Materials*, vol. 8 (5), pp. 689–700 (1979).
Kern et al., "Advances in Deposition Processes for Passivation Films", *J. Vac. Sc. Technol*, vol. 14 (5), Sep.-/Oct. 1977, pp. 1082–1099.
Morosanu et al., "Thin Film Preparation by Plasma and Low Pressure CVD in a Horizontal Reactor", *Vacuum*, vol. 31 (7), pp. 309–313 (1981).
Paul et al., *Solid State Communications*, vol. 20 (10), pp. 969–972 (1976).
Bourdon et al., *Proceedings of the 6th International Conference on Chemical Vapor Deposition*, Electrochemical Society, pp. 220–223 (1977).
Hirose et al., *Proceedings of the 7th International Conference on Amorphous and Liquid Semiconductors*, Univ. of Edinburgh, pp. 352–356 (1977).
Hasegawa et al., *Solid State Communications*, vol. 29 (1), pp. 13–16, (1979).
Sol et al., *Journal of Non-Crystalline Solids, vol. 35 and 36, pp. 291–296 (1980)*.
Brodsky et al., *Proceedings 11th International Conference on the Physics of Semiconductors*, Warsaw, pp. 529–535, Jul. 1972.
Brodsky et al., *Applied Physics Letters*, vol. 21 (7), pp. 305–307 (1972).
Cooks et al., *Applied Physics Letters*, vol. 36 (11), pp. 909–910, (1980).
Fritzsche et al., *Solid State Technology*, Jan. 1978, pp. 55–60.
Postol et al., *Physical Review Letters*, vol. 45 (8), pp. 648–652, (1980).
Hirose et al., *Journal of Non-Crystalline Solids*, vols. 35 and 36, pp. 297–302 (1980).
Taniguchi et al., *Journal of Crystal Growth*, vol. 45, pp. 126–131 (1978).
Vossen and Kern, "Thin-Film Formation" *Physics Today*, May 1980, pp. 26–33.
Aspnes, "Spectroscopic Ellipsometry of Solids", *Optical Properties of Solids, New Developments*, Seraphin, Ed., N. Holland Amsterdam, 1976, pp. 799–846.
Spear et al., *Solid State Communications*, vol. 17, pp. 1193–1195. (1975).
Spear et al., *Philosophical Magazine*, vol. 33 (6), pp. 935–949, (1977).

*Primary Examiner*—John D. Smith
*Attorney, Agent, or Firm*—Peter V. D. Wilde

[57] ABSTRACT

Layers of controllably dopable amorphous silicon and germanium can be produced by means of low pressure chemical vapor deposition, at a reaction temperature between about 450° C. and about 630° C., for Si, and between about 350° C. and about 400° C. for Ge, in an atmosphere comprising a Si-yielding or Ge-yielding precursor such as $SiH_4$ or $GeI_4$, at a pressure between about 0.05 Torr and about 0.7 Torr, preferably between about 0.2 and 0.4 Torr. For undoped Si and P-doped Si, the preferred temperature range is from about 550° C. to about 630° C., for B-doped Si, it is from about 480° C. to about 540° C. The material produced has a density in excess of 0.9 of the corresponding crystalline density, and contains less than 1 atomic percent of hydrogen. An advantageous doping method is addition of dopant-forming precursor, e.g., $PH_3$ or $B_2H_6$, to the atmosphere. The material produced can be transformed into high quality crystalline material, and has many device applications in amorphous form, e.g., in solar cells, vidicon tubes, photocopying, and in integrated circuits, either as a conductor or nonconductor. The layers produced show conformal step coverage.

22 Claims, 9 Drawing Figures

METHOD FOR PRODUCING DEVICES COMPRISING HIGH DENSITY AMORPHOUS SILICON OR GERMANIUM LAYERS BY LOW PRESSURE CVD TECHNIQUE

FIELD OF THE INVENTION

The invention pertains to a method for producing devices comprising high density amorphous Si and Ge layers, the layers produced by chemically reacting gaseous Si- or Ge-yielding precursors.

BACKGROUND

Layers of amorphous silicon and germanium have in the past been produced by a variety of methods, for instance, by sputtering, vacuum evaporation, plasma deposition, and chemical vapor deposition (CVD) at approximately atmospheric pressure. These methods typically result in relatively low density material, often less than 90% of the corresponding crystalline density. The material formed is typically also characterized by a substantial density of deep electronic trap sites, for instance dangling bonds, which result in short lifetimes of free carriers. In order for semiconductor material to be of technological interest, the ability to control its electronic properties by means of substitutional doping is generally required. Early attempts at doping of amorphous silicon and germanium, typically of material produced by sputtering or evaporation, showed that these materials were not suitable for controlled doping.

Several years ago, W. E. Spear and P. G. Le Comber, *Solid State Communications*, Vol. 17, pages 1193-1195 (1975) announced that they had succeeded in substitutionally doping amorphous silicon, and thereby producing changes in conductivity of many orders of magnitude. The material was produced by radio frequency glow discharge decomposition of silane ($SiH_4$).

It is now known that amorphous silicon or germanium (a-Si or a-Ge) produced by means of a glow discharge, or, more generally, by means of plasma deposition, differs from the corresponding materials produced by either sputtering or evaporation primarily in its chemical composition. In particular, plasma deposited a-Si and a-Ge contain substantial amounts of hydrogen, typically between about 10 and 35 atomic percent. The hydrogen is thought not only to saturate dangling bonds, but also to modify the whole structure of the material, permitting a substantial fraction of dopant atoms present to assume substitutional positions. See, for instance, H. Fritzsche et al, *Solid State Technology*, January 1978, pages 55-60. Soon after Spear and LeComber's announcement, amorphous p-n and Schottky barrier junctions were fabricated in several laboratories from plasma-deposited low-density, hydrogen-rich a-Si. As was pointed out by Fritzsche (op. cit.), these developments are of great interest because thin film processing of amorphous semiconductor devices permits easy and cheap manufacture of large area devices on a variety of differently shaped or flexible substrates, as might be needed, for instance, for solar energy applications.

Chemical vapor deposition (CVD) is one of the most important methods for depositing thin layers of a large variety of materials, particularly in solid state electronics. The method comprises reacting constituents of a vapor phase to form a solid product on a substrate surface, commonly by means of pyrolysis, i.e., thermal decomposition of one or more precursor compounds.

Amorphous silicon (and a-Ge) can be deposited by CVD, as was indicated above. Typically, this is done by means of decomposition of $SiH_4$ (or $GeH_4$) at a substrate temperature less than about 700° C. (>450° C.), the atmosphere comprising, in addition to the appropriate precursor and perhaps a dopant precursor such as $PH_3$ or $B_2H_6$, a diluent gas such as nitrogen, hydrogen or argon, the total pressure of the atmosphere being typically near ambient pressure, in any case greater than about 10 Torr. Deposition of a-Si and a-Ge by CVD can result in low-hydrogen material which can be substitutionally doped to some degree. However, the presence of hydrogen in these materials results in an increased doping efficiency and improved transport properties. See, for instance, M. Hirose et al, *Journal of Non-Crystalline Solids*, 35 and 36, pages 297-302, (1980). Hydrogen can be incorporated into the amorphous layers either during the deposition process, or during a subsequent treatment, such as plasma hydrogenation or hydrogen ion implantation. Heavily doped material generally has a room temperature D.C. conductivity of less than about 1 $(ohm.cm)^{-1}$. For instance, P-doped a-Si typically has 0.1 $(ohm.cm)^{-1}$ for a 1:100 dopant-yielding precursor/Si-yielding precursor ratio in the feed gas for the reaction, with the conductivity typically dropping by some six orders of magnitude for a decrease of dopant ratio by two orders of magnitude. See, for instance, M. Hirose et al, (op. cit.). However, N. Sol et al, ibid, pages 291-296, report a conductivity of nearly 1 $(ohm.cm)^{-1}$ for their P-doped a-Si.

Amorphous silicon produced by the above methods typically has an optical bandgap considerably smaller than 1.8 eV, the bandgap of maximally dense a-Si. For instance, some CVD a-Si has been reported to have a gap of 1.45 eV. (M. Hirose et al, op. cit., page 94.) The bandgap energy is usually a sensitive function of the void fraction in a-Si, and thus an indicator of density.

Recently, low pressure CVD (LPCVD) has assumed technological importance. This method typically uses pure reactants at reduced pressure, typically less than about 10 Torr. This method has several advantages over CVD, among them economy, since higher packing density of substrates to be coated is possible, resulting in increased throughput and, therefore, lower production cost. Lower cost also results from the elimination of diluent gases. Also, particulate contamination is generally reduced, and film uniformity improved, resulting in higher yields. LPCVD is currently widely used for depositing films of insulators and of polycrystalline silicon in semiconductor device manufacture.

SUMMARY OF THE INVENTION

We have found a simple and economical method for depositing layers of low-hydrogen, substitutionally dopable, high-density a-Si and a-Ge. The method uses LPCVD with precursor pressures between about 0.05 Torr and about 0.7 Torr, preferably between about 0.2 and 0.4 Torr, reaction temperatures between about 450° C. and about 630° C. for Si, and between about 350° C. and about 400° C. for Ge, and can produce material having a relatively low defect density (vacancies, voids, and electronic defects associated therewith). In particular, the material formed typically has a density of at least 0.9 of the corresponding single crystal density, and a hydrogen content of less than about 1 atomic percent, preferably less than 0.5%. Furthermore, a-Si prepared according to the invention typically has an optical gap energy of at least 1.65 eV.

Despite the absence of significant amounts of hydrogen, the material is readily substitutionally dopable. Thus, relatively high-conductivity material can easily be produced by this method. In addition to use as a conductor material in integrated circuits, material produced according to our method has many other uses, including uses for solar cells, vidicon tubes, and in photocopying. Because material produced by the inventive method has high density it can be readily transformed into high-quality crystalline material, for instance, by laser or e-beam melting. The material also has the property of conformal step coverage, which can be exploited, for instance, for making electrical contact with an underlying conducting layer through an opening in an insulating layer deposited over the former, as is typically required in integrated circuit manufacture.

DEFINITIONS

By "Si- or Ge-yielding precursor" we mean compounds, gaseous at least at the reaction temperature of the deposit-forming reaction, which undergo decomposition at the reaction temperature into elemental semiconductor Si or Ge and gaseous by-products.

Similarly, "dopant-yielding precursor" refers to compounds, gaseous at the reaction temperature, which under the reaction conditions yield an elemental dopant for Si or Ge and gaseous by-products.

By "amorphous" we mean herein not only the usual completely disordered state of solid matter in which long-range order is not detectable by any means, but also a microcrystalline state, with crystals of average crystallite size of up to about 100 Å present, in which some crystallinity may be detectable by some means, such as, for instance, by spectroscopic ellipsometry.

By "low pressure chemical vapor deposition" (LPCVD) we mean a process, carried out inside a reaction vessel, whereby decomposition of a precursor material contained in an atmosphere of less than about 3 Torr total pressure results in deposition of a solid layer onto a substrate maintained in the reaction region at the reaction temperature.

DETAILED DESCRIPTION

As is the case for most elemental solids, the lowest energy state of silicon and germanium is crystalline. Thus, in order to deposit these materials in amorphous form, certain limitations in deposition parameters have to be observed. Furthermore, since previously used methods for depositing layers of a-Si and a-Ge typically result in low density material that contains a large volume fraction of vacancies and voids, it is plausible that, if it is at all possible to achieve deposition of high density material, further refinements in the choice of deposition method and parameters are required. Since high density a-Si and a-Ge layers can be expected to have a relatively low defect density and therefore to have desirable transport properties, a method for manufacturing such layers is of considerable interest.

We have found that it is possible to find conditions that result in the deposition of high density a-Si and a-Ge containing less than about 1 atomic percent of hydrogen, and which can be efficiently doped substitutionally. The conditions include use of LPCVD, with a precursor pressure between about 0.05 Torr and about 0.7 Torr and reaction temperature between about 450° C. and about 630° C. for a-Si, and between about 350° C. and about 400° C. for a-Ge.

Figure 1:
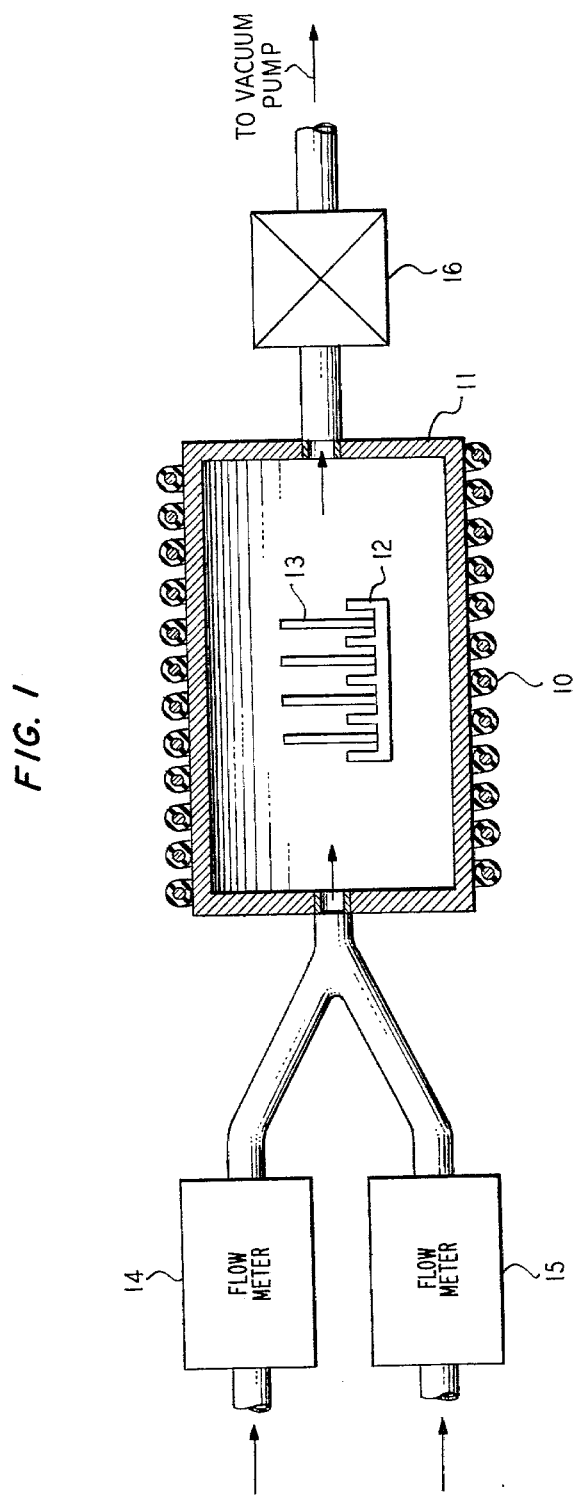
FIG. 1 schematically shows apparatus for LPCVD.

FIG. 1 schematically shows apparatus useful in the practice of the inventive method. Heating means 10, such as, for instance, a resistance heater, are provided in order to raise the temperature of the contents of reaction vessel 11 to the reaction temperature. Sample holder 12 maintains one or more samples, typically thin wafers, in a position inside the reaction zone that is adapted for efficient deposition of the semiconductor layer on the wafer. A vacuum pump is provided for evacuating the reaction vessel and associated vacuum lines prior to start of a deposition run, as well as for establishing and maintaining a predetermined flow of feed gas through the system. Predetermined amounts of Si- or Ge-yielding precursor and dopant-yielding precursor are introduced through flow meters 14 and 15, which serve to establish and monitor the desired flow conditions and reactant concentrations. Unreacted feed gas as well as reaction by-products are removed from the reaction vessel at a controlled rate by the vacuum pump, typically through throttle valve 16. The system as shown in FIG. 1 is, of course, only exemplary, and many variations are either well known in the art or easily devisable by those skilled in the art.

Figure 2:
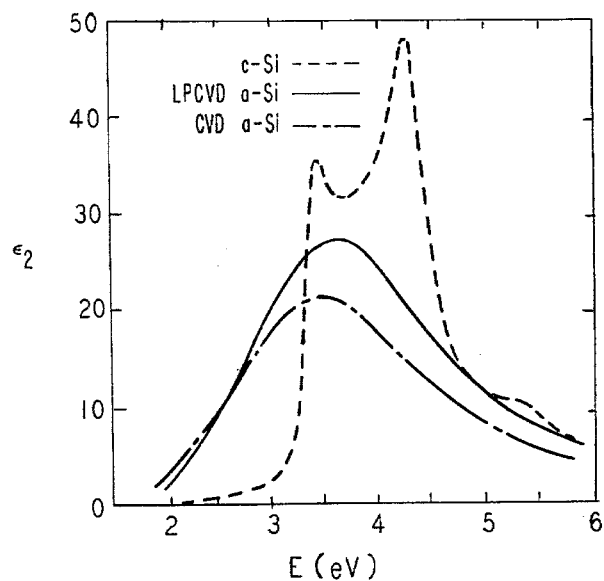
FIG. 2 shows the imaginary part ($\epsilon_2$) of the dielectric function of single crystal silicon, a-Si deposited by CVD, and a-Si deposited by LPCVD at a substrate temperature of 600° C.

Since one important aspect in which material produced by the inventive method differs from prior art material is its density, we will next briefly discuss a convenient method for determining the density of thin layers. As is well known, the dielectric function of any sample of matter is directly related to the polarizability per unit volume of the sample. Because the dielectric function of free space is real, whereas on the other hand the dielectric function of elemental semiconductors typically has a large imaginary part ($\epsilon_2$) for at least part of the easily accessible part of the optical and near UV spectrum, appropriate optical methods that determine $\epsilon_2$ are potentially useful for determining the density of the thin layers of interest herein. In particular, spectroscopic elipsometry, as described for instance in D. E. Aspnes, "Spectroscopic Ellipsometry of Solids", *Optical Properties of Solids, New Developments*, B. O. Seraphin, Ed., N. Holland, Amsterdam 1976, pp. 799–846, constitutes not only a convenient and sensitive method for determining the density of such materials, but also for determining the degree of crystallinity of the material. This is illustrated in FIG. 2, where $\epsilon_2$ is shown for monocrystalline silicon (c-Si), for amorphous silicon as deposited by the instant method (LPCVD a-Si), and for amorphous silicon deposited by a prior art method (CVD a-Si), for the spectral regime from about 2 eV to about 6 eV. The difference in functional form of $\epsilon_2$ between c-Si and a-Si is evident, as is the difference in the peak height between the low-density CVD a-Si and the high-density LPCVD material. The peak value of $\epsilon_2$ thus represents a sensitive indicator of material density in a-Si and a-Ge.

Figure 3:
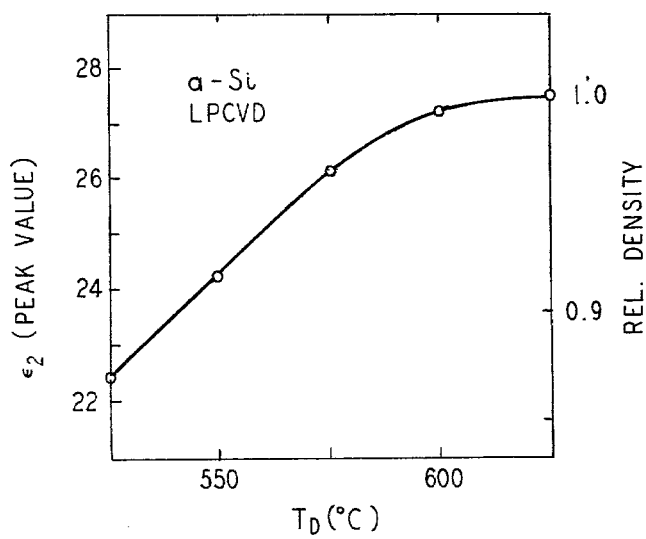
FIG. 3 shows the maximum value of $\epsilon_2$ of LPCVD a-Si as a function of substrate temperature.

FIG. 3 shows the peak value of $\epsilon_2$ of a-Si, deposited by LPCVD at a pressure of 0.2 Torr, as a function of deposition temperature. The Figure also shows the relationship of the measured peak value of $\epsilon_2$ to the relative density of the deposited material. Thus, for instance, a peak $\epsilon_2$ of approximately 23.6 indicates a relative density of 0.9 in undoped amorphous silicon. However, the maximum value of $\epsilon_2$ is somewhat dependent on dopant level. FIG. 3 shows that an a-Si layer of relative density greater than 0.9 results for deposition temperatures above about 540° C. and a pressure of precursor of about 0.2 Torr, in the absence of any dopant-yielding precursor.

Figure 4:
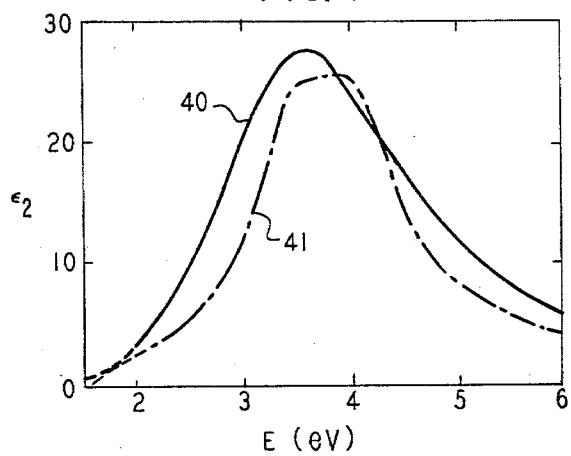
FIG. 4 shows $\epsilon_2$ of LPCVD a-Si having no measurable crystalline order, and LPCVD a-Si containing microcrystals of <100 Å size, both materials deposited at 625° C.

FIG. 4 shows $\epsilon_2$ measured on two different LPCVD silicon layers deposited at a reaction temperature of 625° C. Curve 40, showing the familiar smooth, structureless shape, is obtained from a film deposited using 0.2 Torr of silane. Curve 41 was obtained from a film that was deposited at a silane pressure of 0.05 Torr, and shows features indicative of the presence of some crystallinity in the sample. In particular, the peak is narrowed, and near 3.4 and 4.1 eV abrupt changes in slope appear. Analysis of the measurements indicates that the film deposited at lower pressure contains microcrystals of average size of about 100 Å or less.

Figure 5:
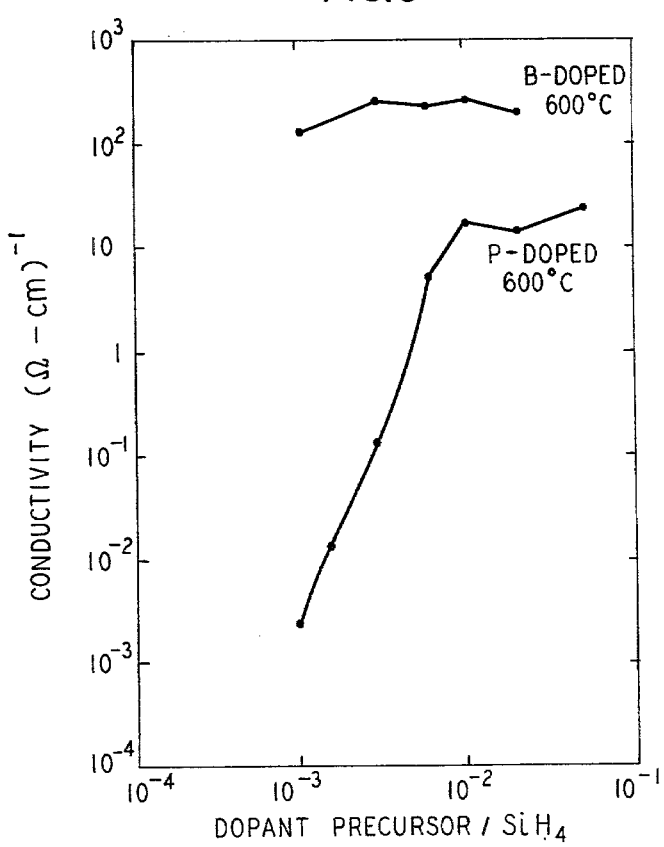
FIG. 5 shows the room temperature D.C. conductivity of doped LPCVD a-Si as a function of the ratio of dopant precursor to semiconductor precursor in the feed gas.

As we have indicated above, one of the advantageous features of material produced according to the inventive method is its ability to be doped efficiently, resulting in relatively high electrical conductivity. FIG. 5 illustrates this, by showing the conductivity of phosphorous-doped and boron-doped LPCVD a-Si films, deposited at 600° C. and 0.2 Torr precursor pressure, as a function of the dopant precursor/silane ratio. In the case of P-doping, the room-temperature D.C. conductivity increases by about four orders of magnitude when changing the precursor ratio by one order of magnitude, from about $10^{-3}$ to $10^{-2}$ with a maximum conductivity of approximately 20 $(ohm.cm)^{-1}$ at a $PH_3/SiH_4$ ratio of about $10^{-2}$. In the case of B-doping the conductivity shows little variation for $B_2H_6/SiH_4$ ratios between about $10^{-3}$ and $10^{-2}$, remaining near 300 $(ohm.cm)^{-1}$. Still greater dopant levels typically result in substantially no further increases in conductivity.

A variety of elements are suitable as dopants, among them B, P, As, Al and Sb. Similarly, a variety of useful dopant-forming precursors are available, among them $B_2H_6$, $BCl_3$, $PH_3$, $PCl_3$, $AsH_3$, $AsCl_3$, $AlCl_3$, and $SbCl_5$. And although hydrides such as $SiH_4$ and $GeH_4$ can advantageously be used as semiconductor-forming precursors, other precursors such as $Si_2H_6$, $GeI_2$, $GeI_4$, or $GeBr_4$ can be usefully employed, provided their minimum reaction temperature is not greater than the maximum amorphous deposition temperature of the semiconductor being deposited. If the reaction temperature of a halide-containing precursor is too high, it can in appropriate circumstances be lowered by introduction of a small amount of $H_2$ into the atmosphere. Undoped silicon, deposited at temperatures greater than about 640° C. and at presures relevant to this disclosure, typically is polycrystalline, with crystalline sizes larger than about 100 Å. The corresponding temperatures of doped elemental semiconductors depend somewhat on dopant and dopant level, and thus typically have to be established by a simple experiment.

The region of the pressure/temperature space that is appropriate to the practice of the inventive method is quite limited. The upper limit is typically reached when gas-phase reactions become sufficiently important to result in the deposition of material of density below an acceptable minimum density. This pressure is typically about 0.7 Torr. The presence of diluent gas typically affects both deposition rate and deposit density, and we consider the upper limit of total pressure to be about 3 Torr. The lower limit of precursor pressure is primarily a function of what constitutes an acceptable deposition rate. However, we consider 0.05 Torr to be the pressure below which deposition rates are too low for most practical purposes. The preferred precursor pressure range for deposition of doped as well as of undoped a-Si or a-Ge we find to be from about 0.2 to about 0.4 Torr.

The appropriate temperature limits depend, inter alia, on the nature and concentration of dopant-yielding precursor, as was indicated above. Material formed at a temperature in excess of the maximum amorphous deposition temperature is typically polycrystalline, with average crystal size greater than about 100 Å, whereas material formed at or below this temperature is typically amorphous. We find that an appropriate upper temperature for undoped Si is about 630° C., and for undoped Ge about 400° C. The corresponding temperature for P-doped Si is also about 630° C., and for B-doped Si about 540° C. Since the deposition rate is temperature dependent, typically increasing approximately exponentially with increasing temperature, it is advantageous to practice the inventive method at temperatures near the upper amorphous deposition temperature. We find that appropriate temperature range is from about 550° C. to about 630° C. for both undoped and P-doped Si, with about 500° C. the temperature below which deposition rates are typically too low for practical purposes, and about 480° C. to 540° C. and about 450° C. the corresponding range and lower temperature limit, respectively, for B-doped Si. The lower temperature limit for a-Ge is about 350° C.

Doping typically has an effect on the deposition rate of a-Si or a-Ge. For instance, under conditions at which the deposition rate of undoped a-Si is 100 Å/min the rate more than doubles upon addition of 1 percent of $B_2H_6$ to the $SiH_4$, and drops by about two-thirds upon addition of about 1 percent of $PH_3$.

EXAMPLES

Below are summarized exemplary deposition conditions for silicon, and some parameters of the resulting films.

|  | Undoped | P-doped | B-doped |
|---|---|---|---|
| Reaction Temperature, °C. | 600 | 600 | 600 | 600 |
| SiH$_4$ Flow, cc/min | 400 | 400 | 400 | 400 |
| Dopant precursor flow, cc/min | — | 1.2 | 2.4 | 2.4 |
| Pressure, Torr | 0.18 | 0.193 | 0.20 | 0.22 |
| Film Thickness, Å | 5250 | 2250 | 3850 | 3975 |
| R.T. Conductivity (ohm · cm)$^{-1}$ | <10$^{-6}$ | 0.13 | 4.8 | 252 |
| State of Aggregation | * | * | ** | ** |

*Amorphous, with no detectable microcrystals
**Amorphous, with microcrystals of size ≲100 Å
All experimental results disclosed herein were obtained with atmospheres containing no diluent gas.

Layers of amorphous semiconductor deposited according to the invention have many device uses. For instance, because of the high density and relatively low defect density of the amorphous material, the material solidifies smoothly and uniformly after having been melted briefly, as for instance by localized exposure to intense electromagnetic radiation (e.g., laser beam) or to a particle beam (e.g., electron beam), and results in high-quality crystalline material, as is required for instance for integrated circuits.

Other exemplary uses depend, inter alia, on the advantageous transport properties of material deposited according to the invention, typically long carrier lifetime and high electrical conductivity, together with its dopability that permits sensitive control of electronic properties, including conductivity type. Among these applications is use in photovoltaic cells, i.e., solar cells, which typically require formation of a non-linear junction, e.g., a p-n junction or a Schottky diode.

For instance, silicon deposited according to the invention was found to form a Pt/a-Si Schottky barrier with barrier height of about 150 mV, and having a reverse characteristic in excess of $10^7$ (ohm.cm$^{-2}$). When measured under AM1 conditions, a similar Pt/a-Si (unannealed) sandwich was measured to have an open-circuit voltage of 50 mV. Since it is well known that these parameters are highly fabrication-sensitive, the above values constitute lower limits only, and are not meant to indicate ultimately achievable values.

Uses of material prepared according to the invention in light-sensitive devices that do not require formation of junctions is also possible, as for instance, as active element in vidicon tubes, or in photocopying apparatus.

Figure 6:
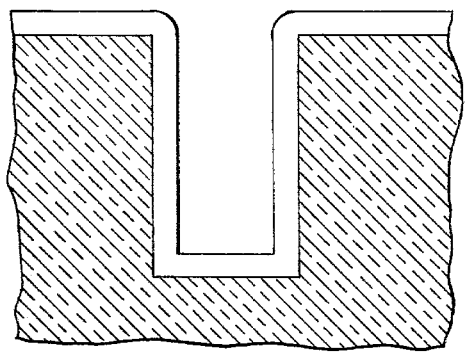
FIG. 6 schematically illustrates conformal step coverage.
Figure 7:
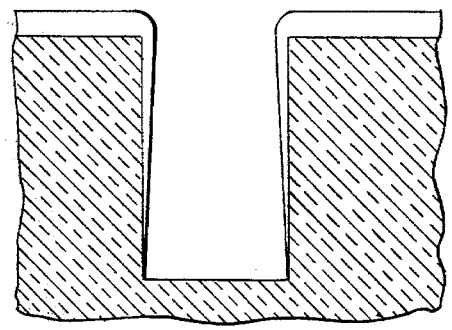
FIG. 7 gives a schematic example of nonconformal step coverage.

Although doped layers prepared according to the invention can be used to form planar conductors in integrated circuits, typically having conductivity greater than about 1 (ohm.cm)$^{-1}$, preferably in excess of about 10 (ohm.cm)$^{-1}$, advantageous applications of these materials, in particular, of a-Si, utilize also the conformal step-covering ability of materials deposited according to the invention. True conformal step coverage requires that the thickness of a deposited layer be substantially the same everywhere on a featured substrate, as is schematically illustrated in FIG. 6, to be contrasted with FIG. 7, which shows a common example of nonconformal step coverage. The Figures show in cross-section grooved surfaces exemplifying, for instance, features etched into a silicon wafer, or windows etched through processing layers, onto which in FIG. 6 a step-conforming layer of material is deposited, whereas in FIG. 7 the layer is nonstep-conforming as would, for instance, result if the layer is deposited by means of vacuum evaporation.

Figure 8:
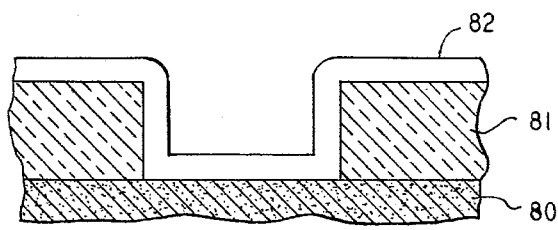
FIG. 8 schematically shows one exemplary application of a step-conforming conductive layer according to the invention, namely, to establish electrical contact with an underlying conductive layer through a window in an insulating layer.
Figure 9:
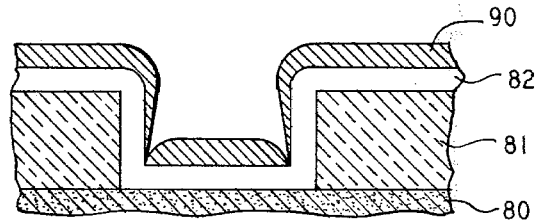
FIG. 9 shows another exemplary application, namely, joint use of a conductive step-conformal layer and a metallic non-conformal layer to establish electrical contact through a window.

Doped amorphous semiconductor material deposited according to the invention can for instance advantageously be used to make electrical contact with material through a window in an overlying insulating layer, as is schematically indicated in FIG. 8 which shows conductive layer 80 partially covered by insulating layer 81, with a window penetrating 81. Amorphous semiconductor layer 82, typically a-Si doped to a conductivity greater than about 1 (ohm.cm)$^{-1}$, is deposited and establishes electrical contact with layer 80. A semiconductor layer can be used either by itself, as in FIG. 8, or in conjunction with a later-deposited second conductive layer 90, e.g., evaporated Al, as shown in FIG. 9.

The above listing of examples of device use of materials prepared according to the invention is of course not meant to be exhaustive, and those skilled in the art will be readily able to utilize these materials in other applications. For instance, conformal step-coverage can be exploited in undoped as well as in doped materials, for instance as a means of applying a layer of a-Si over a surface having deep or narrow features.

What is claimed is:

1. Method for producing a device comprising a layer of amorphous material on a substrate, with the material selected from the group consisting of silicon and germanium, where "amorphous material" refers to material containing substantially no microcrystals of more than about 100 Å size, the method comprising
   (a) heating at least part of the substrate to a reaction temperature, and
   (b) contacting at least part of the substrate surface heated to the reaction temperature with an atmosphere comprising a Si-yielding or Ge-yielding precursor, CHARACTERIZED IN THAT
   (c) the atmosphere has a total pressure of no more than about 3 Torr, and a precursor pressure between about 0.05 Torr and about 0.7 Torr,
   (d) the reaction temperature is between about 450° C. and about 630° C. for silicon, and between about 350° C. and about 400° C. for germanium, and
   (e) the material produced contains less than about 1 atomic percent of hydrogen, and has a density of at least 90% of the density of the corresponding crystalline semiconductor.

2. Method of claim 1, wherein the atmosphere comprises at least one dopant-yielding precursor.

3. Method of claim 2, wherein the atmosphere comprises SiH$_4$ or GeI$_4$.

4. Method of claim 2, wherein the dopant-yielding precursor is selected from the group consisting of B$_2$H$_6$, PH$_3$, and AsH$_3$.

5. Method for producing a device comprising a layer of amorphous silicon on a substrate, where "amorphous silicon" refers to silicon containing substantially no microcrystals of more than about 100 Å size, the method comprising
   (a) heating at least part of the substrate to a reaction temperature, and
   (b) contacting at least part of the substrate surface heated to the reaction temperature with an atmosphere comprising SiH$_4$, CHARACTERIZED IN THAT
   (c) the atmosphere has a total pressure of no more than about 3 Torr, and a SiH$_4$ pressure between about 0.05 Torr and about 0.7 Torr, (d) the reaction temperature is between about 450° C. and about 630° C., and (e) the silicon produced contains less than about 1 atomic percent of hydrogen, has a density of at least 90% of the density of crystalline silicon, and an optical bandgap of at least about 1.65 eV.

6. Method of claim 5, wherein the atmosphere substantially consists of $SiH_4$ and at least one dopant-forming precursor.

7. Method of claim 6, wherein the dopant forming precursor is selected from the group consisting of $B_2H_6$, $PH_3$, and $AsH_3$.

8. Method of claim 6, wherein the $SiH_4$ pressure is between about 0.2 and 0.4 Torr, and the reaction temperature is between about 480° C. and about 630° C.

9. Method of claim 8 wherein the dopant-yielding precursor is $PH_3$, and the reaction temperature is between about 550° C. and about 630° C.

10. Method of claim 8 wherein the dopant-yielding precursor is $B_2H_6$, and the reaction temperature is between about 480° C. and about 540° C.

11. Method of claim 5, wherein the atmosphere substantially consists of $SiH_4$, with the $SiH_4$ pressure between about 0.2 Torr and about 0.4 Torr, and the reaction temperature between about 550° C. and about 630° C.

12. Method of claim 9 or 10 wherein the layer produced has a room-temperature D.C. conductivity of at least about 1 $(ohm.cm)^{-1}$.

13. Method of claim 1 or 5 comprising the further step of melting at least part of the amorphous layer subsequent to deposition of the amorphous layer.

14. Method of claim 13 wherein the layer is melted by means of a beam of electromagnetic radiation or by means of a particle beam.

15. Method of claim 1 or 5 comprising the further step of forming in the amorphous layer a region of one conductivity type and a region of the opposite conductivity type.

16. Method of claim 15 wherein the two regions form a p-n junction.

17. Method of claim 1 or 5 comprising the further step of contacting at least one major surface of the amorphous layer with a metal conductor.

18. Method of claim 17 wherein the amorphous layer and the metal conductor form a Schottky diode.

19. Method of claim 1 or 5 wherein the amorphous layer forms a continuous electrically conductive path through an apertured insulating processing layer between a major surface of the article and a region of the article underlying the aperture.

20. Method of claim 19 wherein a metallic layer is deposited over at least part of the continuous conductive path.

21. Method of claim 19 wherein the amorphous layer consists essentially of doped silicon having a conductivity of at least about 1 $(ohm-cm)^{-1}$.

22. Method of claim 20 wherein the amorphous layer consists essentially of doped silicon having a conductivity of at least about 1 $(ohm-cm)^{-1}$.

* * * * *